US007846646B2

United States Patent
Kamijima

(10) Patent No.: US 7,846,646 B2
(45) Date of Patent: Dec. 7, 2010

(54) RESIST PATTERN FORMING METHOD, THIN-FILM PATTERN FORMING METHOD, AND MICRODEVICE MANUFACTURING METHOD

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 566 days.

(21) Appl. No.: 11/699,026

(22) Filed: Jan. 29, 2007

(65) Prior Publication Data
US 2007/0248916 A1    Oct. 25, 2007

(30) Foreign Application Priority Data
Apr. 21, 2006   (JP) .............................. 2006-117699

(51) Int. Cl.
*G03F 7/26*   (2006.01)
(52) U.S. Cl. .................. 430/315; 430/324; 430/325
(58) Field of Classification Search .................. 430/313, 430/322, 311, 324, 314, 329, 325
See application file for complete search history.

(56) References Cited

U.S. PATENT DOCUMENTS 6,376,157 B1 * 4/2002 Tanaka et al. ............... 430/314
6,416,933 B1 * 7/2002 Singh et al. .................. 430/313
6,572,917 B2 * 6/2003 Narisawa et al. ............. 427/130
6,933,247 B2 * 8/2005 Byun et al. .................. 438/781

FOREIGN PATENT DOCUMENTS

| JP | A 6-252040 | 9/1994 |
|---|---|---|
| JP | A 11-204399 | 7/1999 |
| JP | A 2004-247399 | 9/2004 |

* cited by examiner

*Primary Examiner*—Kathleen Duda
*Assistant Examiner*—Caleen O Sullivan
(74) *Attorney, Agent, or Firm*—Oliff & Berridge, PLC

(57) ABSTRACT

A resist pattern forming method comprises the steps of plasma-processing a surface of an acid-feedable resist layer formed and patterned on a surface of a substrate in a gas atmosphere containing a fluorocarbon; attaching a resin composition crosslinkable in the presence of an acid to the plasma-processed surface of the resist layer; crosslinking the resin composition in a part in contact with the resist layer by feeding an acid from the resist layer, so as to form a crosslinked layer covering the resist layer; and removing the resin composition from a part excluding the crosslinked layer, so as to yield a resist pattern comprising the resist layer and the crosslinked layer covering the resist layer.

6 Claims, 5 Drawing Sheets

(a)

(b)

(c)

(a)

(b)

(c)

(a)

(b)

(a)

(b)

RESIST PATTERN FORMING METHOD, THIN-FILM PATTERN FORMING METHOD, AND MICRODEVICE MANUFACTURING METHOD

BACKGROUND OF THE INVENTION

1. Field of the Invention

The present invention relates to a resist pattern forming method, a thin-film pattern forming method, and a microdevice manufacturing method.

2. Related Background Art

In recent years, studies for making thin-film patterns finer have been underway in order to attain a higher density in microdevices having thin films such as thin-film magnetic heads, semiconductor devices, and MEMS devices. Its typical example is a method using a resist pattern which will be explained in the following.

First, a resist layer is formed on a thin film. This layer is exposed to light through a photomask, and is developed with an alkaline developer, so as to form a resist pattern. Finally, the thin film in the part not covered with the resist pattern is removed by dry etching or the like; or a plating layer is deposited thereon, then the resist pattern is removed, and the thin film in the part not covered with the plating layer is removed by dry etching or the like, whereby the thin-film pattern can be formed.

Though the thin-film pattern becomes finer as a gap (which will also be referred to as "trench width" in the following) in the resist pattern is made narrower, the trench width is hard to become narrower than a predetermined level because of an optical limit at the time of exposure.

On the other hand, a method known as so-called RELACS has been reported, which can further narrow the trench width in the method of forming a thin-film pattern by using a resist pattern. For example, methods disclosed in Japanese Patent Application Laid-Open Nos. H 11-204399, H6-252040, and 2004-247399 form a pattern of an acid-feedable resist layer by heating or exposure to light, applies a resin composition crosslinkable in the presence of an acid onto the pattern, and heats the composition, so as to form a crosslinked layer on the surface of the resist layer, whereby a new resist pattern having a narrower trench width made of the former resist pattern and the crosslinked layer can be formed.

SUMMARY OF THE INVENTION

However, it has recently been demanded to form a resist pattern having a further narrower trench width, which has not sufficiently been achieved by the conventional RELACS method. In view of the problem mentioned above, it is an object of the present invention to provide a resist pattern forming method which can form a resist pattern having a sufficiently narrow trench width, and a thin-film pattern forming method and microdevice manufacturing method using the same.

The inventors found that the surface of the acid-feedable resist layer is alkaline in the above-mentioned RELACS method since this layer is patterned with an alkaline developer, and that the crosslinked layer formed on the resist layer can be made thicker than that conventionally available when the surface of the resist layer is acidified beforehand by a predetermined plasma process, thereby achieving the present invention.

The resist pattern forming method in accordance with the present invention comprises the steps of plasma-processing a surface of an acid-feedable resist layer formed and patterned on a surface of a substrate in a gas atmosphere containing a fluorocarbon; attaching a resin composition crosslinkable in the presence of an acid to the plasma-processed surface of the resist layer; crosslinking the resin composition in a part in contact with the resist layer by feeding an acid from the resist layer, so as to form a crosslinked layer covering the resist layer; and removing the resin composition from a part excluding the crosslinked layer, so as to yield a resist pattern comprising the resist layer and the crosslinked layer covering the resist layer.

The present invention can form a resist pattern having a trench width sufficiently narrower than that conventionally available. The reason why such effects are obtained by the resist pattern forming method of the present invention is not exactly clear, but the inventors presume as follows:

Fluorine radicals and the like occur when plasma is generated in a gas atmosphere containing a fluorocarbon. These fluorine radicals react with the moisture in the resist layer, thereby generating hydrofluoric acid and the like. This acidifies the surface of the resist layer effectively. Therefore, the acid from the resist layer is sufficiently fed to the resin composition without being consumed by neutralization of alkalis on the surface of the resist layer and the like, so that a sufficiently thick crosslinked layer can be formed, whereby a resist pattern having a sufficiently narrow trench width can be obtained.

The method of the present invention uses neither acidic liquid nor acidic gas, and thus has substantially no fear of corroding the part other than the resist pattern.

Preferably, the part in contact with the resist layer in the resin composition is crosslinked by heating or exposure to light in the step of forming the crosslinked layer. This can feed the acid from the resist layer to the resin composition more effectively, whereby a thicker crosslinked layer can be obtained.

The thin-film pattern forming method of the present invention comprises the steps of forming a resist pattern on a thin film of a substrate having a surface formed with the thin film by the above-mentioned method of the present invention; removing the thin film from a part free of the resist pattern by etching; and removing the resist pattern, so as to yield a thin-film pattern.

Alternatively, the thin-film pattern forming method of the present invention comprises the steps of forming a resist pattern on a thin film of a substrate having a surface formed with the thin film by the above-mentioned method of the present invention; forming a plating layer on the thin film in a part free of the resist pattern and then removing the resist pattern; and removing the thin film from the part free of the resist pattern by etching, so as to yield a thin-film pattern laminated with the plating layer.

These thin-film pattern forming methods of the present invention can manufacture a sufficiently fine thin-film pattern by using a resist pattern having a sufficiently narrow trench width formed by the above-mentioned method of the present invention as a mask pattern.

The present invention also provides a microdevice manufacturing method comprising the step of forming a thin-film pattern by the above-mentioned thin-film pattern forming method of the present invention. The microdevice manufacturing method of the present invention can yield a microdevice having a sufficiently high density.

The present invention provides a resist pattern forming method which can form a resist pattern having a sufficiently narrow trench width, and a thin-film pattern forming method and microdevice manufacturing method using the same.

DESCRIPTION OF THE PREFERRED EMBODIMENTS

In the following, preferred embodiments of the present invention will be explained in detail. However, the present invention is not limited to the following embodiments.

Figure 1:
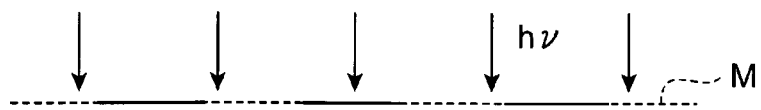
FIG. 1 is a sectional view for explaining an embodiment of the resist pattern forming method in accordance with the present invention.
Figure 1:
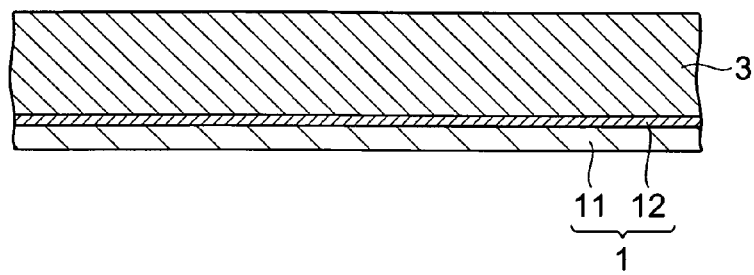
Figure 1:
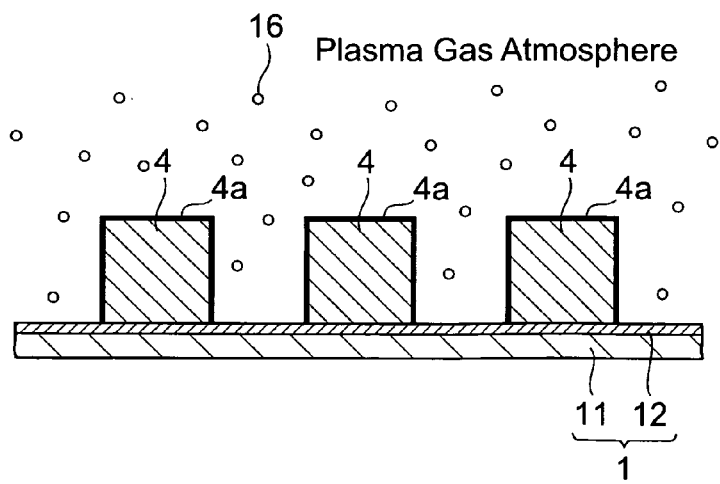
Figure 2:
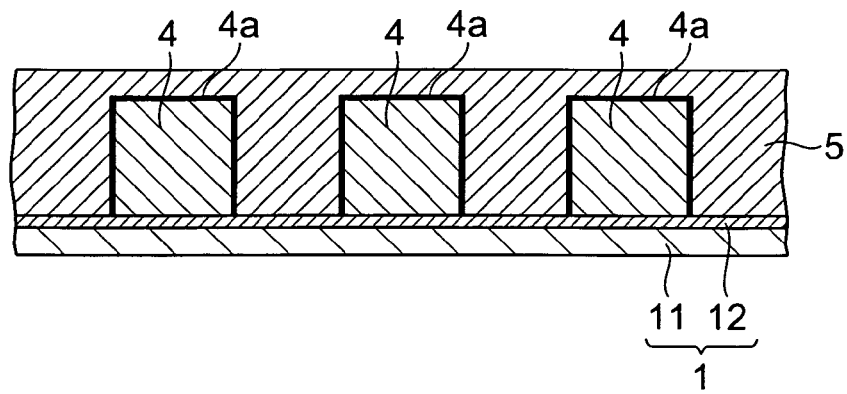
FIG. 2 is a sectional view for explaining the embodiment of the resist pattern forming method in accordance with the present invention.
Figure 2:
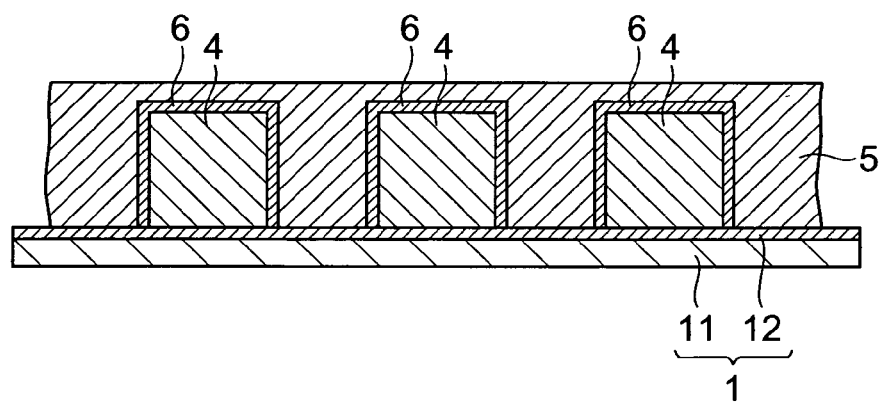
Figure 2:
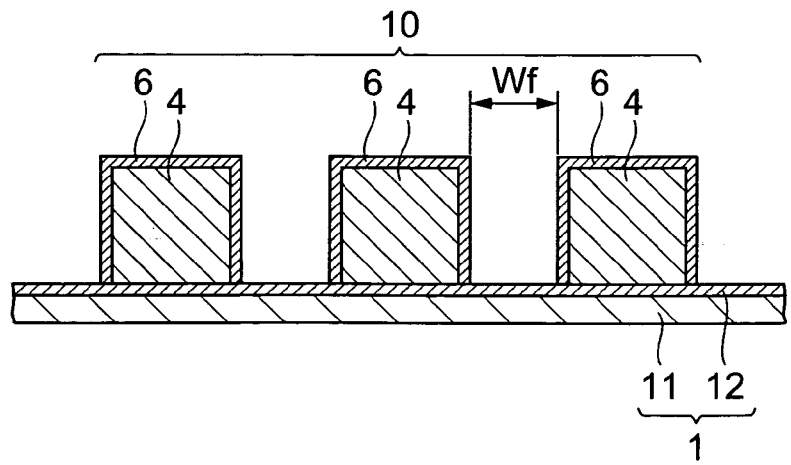

FIGS. 1 and 2 are sectional views showing one embodiment of the resist pattern forming method. FIG. 1 shows a step ((a), (b)) of forming an acid-feedable, patterned resist layer 4 on a surface of a substrate 1 and a step (c) of plasma-processing a surface 4a of the resist layer in a gas atmosphere containing a fluorocarbon 16, so as to acidify it; whereas FIG. 2 shows a step (a) of attaching a resin composition crosslinkable in the presence of an acid to the resist layer 4, a step (b) of feeding an acid from the resist layer in this state, so as to cover the resist layer 4 with a crosslinked layer 6 formed by crosslinking the part of the resin composition in contact with the surface 4a of the resist layer, and a step (c) of removing the resin composition from the part excluding the crosslinked layer 6.

In this embodiment, as shown in (a) of FIG. 1, a photosensitive resin layer 3 formed on a surface of the substrate 1 is initially irradiated with active light beams such as UV rays through a mask M written with a predetermined pattern, so as to make a predetermined part of the photosensitive resin layer 3 soluble in an alkaline aqueous solution (exposure to light). Thereafter, the photosensitive resin layer 3 is developed with an alkaline developer, so as to form the resist layer 4 having a predetermined pattern as shown in (b) of FIG. 1. When exposing the photosensitive resin layer 3 to light, light at a wavelength of 248 nm (KrF excimer laser), 192 nm (ArF excimer laser), or the like is irradiated by using a stepper, scanner, or the like. Here, let Wr be the trench width of the resist layer 4 in (b) of FIG. 1.

The substrate 1 has a structure in which a thin film 12 as a film to be patterned is laminated on a support 11 made of a ceramic material such as Si, $Al_2O_3 \cdot TiC$, or the like. The thin film 12 is made of a conductive or soft magnetic metal such as Ni, Cu, or NiFe, a conductive material such as a conductive metal oxide or conductive organic matter, or an insulating material such as ceramic, for example, while its thickness is preferably 0.01 to 1.0 μm. The thin film 12 is formed by a method such as sputtering, CVD, vapor deposition, or electroless plating.

The photosensitive resin layer 3 is made of a photosensitive resin containing an acid-generating material which generates an acid upon heating or exposure to light and becoming soluble in an alkaline aqueous solution upon exposure to active light beams. The thickness of the photosensitive resin layer 3 is preferably 0.1 to 10 μm. The photosensitive resin layer 3 can be formed, for example, by applying a coating liquid in which a photosensitive resin is dissolved or dispersed in a solvent onto the substrate 1 by spin coating or the like and then removing the solvent from within the coating liquid by heating or the like. The photosensitive resin layer 3 may be prebaked by heating before exposure to light if necessary.

As the photosensitive resin containing the acid-generating material, those conventionally known can be employed. For example, NQD-novolac resists containing a naphthoquinonediazide derivative (NQD) which is an acid-generating material and a novolac resin, NQD-esterified novolac resists in which NQD is combined to a novolac resin by an ester bond, or polyhydroxystyrene-based chemically-amplified resists containing an onium salt such as sulfonium salt as an acid-generating material are used favorably.

After exposing the photosensitive resin layer 3 to light, the exposed part is removed by using an alkali developer such as an aqueous solution containing 2.38 mass % of tetramethylammonium hydroxide, so as to develop the photosensitive resin layer 3, thereby forming the patterned resist layer 4. After the development, the photosensitive resin layer 3 was washed with rinse water, whereby the attached developer is removed.

Next, as shown in (c) of FIG. 1, the surface 4a of the patterned resist layer is plasma-processed in a gas atmosphere containing a fluorocarbon 16. This acidifies the surface 4a of the resist layer.

The gas containing the fluorocarbon 16 may be either a single gas made of the fluorocarbon 16 or a mixed gas containing gases such as oxygen, nitrogen, and hydrogen. The fluorocarbon 16 is preferably a fluorocarbon having a carbon number of 1 to 3, specific examples of which include hydrofluorocarbons such as fluoromethane, difluoromethane, and trifluoromethane, and perfluorocarbons such as perfluoromethane, perfluoroethane, and perfluoropropane.

The plasma processing is performed by exposing the patterned resist layer 4 together with the substrate 1 to a gas containing the fluorocarbon turned into plasma. The excitation method for turning the gas into plasma and the species of plasma may be any of inductively-coupled plasma generated by radiofrequency waves due to high frequencies, capacitively-coupled plasma, surface-wave plasma using microwaves, and the like.

The total pressure of the gas containing the fluorocarbon 16 at the time of plasma processing is preferably 100 to 150 Pa, whereas the partial pressure of the fluorocarbon 16 is preferably 10 to 30 Pa. The power for the plasma processing is preferably 100 to 1,000 W.

Subsequently, as shown in (a) of FIG. 2, a resin composition crosslinkable in the presence of an acid is attached onto the substrate 1 and resist layer 4, so as to form a resin composition layer 5. The resin composition layer 5 is formed by spin coating or the like, whereas its preferred thickness is 0.01 to 0.3 μm. The resin composition layer 5 may be formed in the state where the above-mentioned rinse water is attached to the resist layer 4 or after the rinse water is eliminated.

In this state, the resist layer 4 and resin composition layer 5 are heated or exposed to light, so as to feed an acid from the resist layer, thereby crosslinking the part of the resin composition in contact with the resist layer, which forms a crosslinked layer 6 covering the resist layer ((b) of FIG. 2). When forming the crosslinked layer 6 by heating, it will be preferred if the whole is heated to 80 to 120° C. by using a hotplate or the like, for example.

Then, the resin composition is removed by washing with water or the like from the part excluding the crosslinked layer 6, whereby a resist pattern 10 constituted by the resist layer 4 and the crosslinked layer 6 covering the same is obtained ((c) of FIG. 2). Let Wf be the trench width of the resist pattern 10 here.

Though not restricted in particular, an example of the resin composition crosslinkable in the presence of an acid is one containing a water-soluble resin made of a water-soluble polymer, a water-soluble crosslinking agent which crosslinks the water-soluble resin, and a solvent dissolving them.

Examples of the water-soluble resin include polyacrylic acid, polyvinylacetal, polyvinylpyrrolidone, polyvinylpyrrolidone-polyvinyl acetate copolymers, polyvinylalcohol, polyethyleneimine, polyethyleneoxide, styrene-maleic acid copolymers, polyvinylamine resins, polyallylamine, oxazoline-group-containing water-soluble resins, water-soluble melamine resins, water-soluble urea resins, alkyd resins, and sulfonamide resins. They may be used singly or in combinations of a plurality of species.

The water-soluble crosslinking agent is a component adapted to react and combine with polymers which are water-soluble resins, thereby crosslinking the polymers. Specific examples of the water-soluble crosslinking agent include urea-based crosslinking agents such as urea, N-alkoxymethyleneurea, ethyleneurea, and ethyleneurea carboxylic acid; melamine-based crosslinking agents such as melamine and alkoxymethylenemelamine; and amino-based crosslinking agents such as benzoguanamine and glycoluryl.

Instead of using the water-soluble crosslinking agents such as those mentioned above, an acid-generating agent (e.g., an organic acid amine salt such as p-toluenesulfonic acid triethylamine salt) which generates an acid upon heating or exposure to light may be used, so that, in the presence of the acid generated therefrom, polymers in the water-soluble resin may be caused to react with each other, thereby crosslinking the water-soluble resin. In this case, the water-soluble crosslinking agent and oxygen-generating agent may be used together.

Not only water, but also water-soluble organic solvents such as alcohol and mixed liquids of water and water-soluble organic solvents are usable as the solvent for dissolving the water-soluble resin.

Preferably, the resin composition contains 70 to 95 mass % of a solvent which dissolves components such as the water-soluble resin, water-soluble crosslinking agent, and acid-generating agent.

The resin composition may contain a surfactant in addition to the foregoing components. Favorably employable as the surfactant are acetylene alcohol and its polyethoxylates, acetylene glycol and its polyethoxylates, and the like. Examples of commercial products employable as the surfactant include water-soluble surfactants such as Fluorad (product name) manufactured by 3M, Nonipol (product name) manufactured by Sanyo Chemical Industries, Ltd., and Acetylenol EL (product name) manufactured by Kawaken Fine Chemicals Co., Ltd.

Thus obtained resist pattern 10 having the resist layer 4 and crosslinked layer 6 can make a trench width sufficiently narrower than that in conventional resist patterns. This seems to be because the plasma processing in the gas atmosphere containing a fluorocarbon effectively acidifies the surface of the resist layer, so that the acid from the resist layer is sufficiently fed to the resin composition without being consumed by neutralization of alkalis on the surface of the resist layer and the like. Under a reduced pressure at the time of plasma processing, moisture hardly exists on the substrate surface, so that no acid is generated, whereby no resin crosslinked layer is left on the substrate surface.

Figure 3:
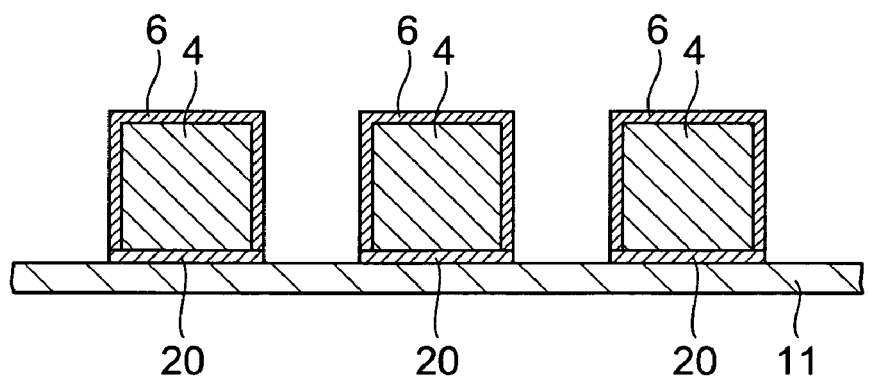
FIG. 3 is a sectional view for explaining an embodiment of the thin-film pattern forming method in accordance with the present invention.
Figure 3:
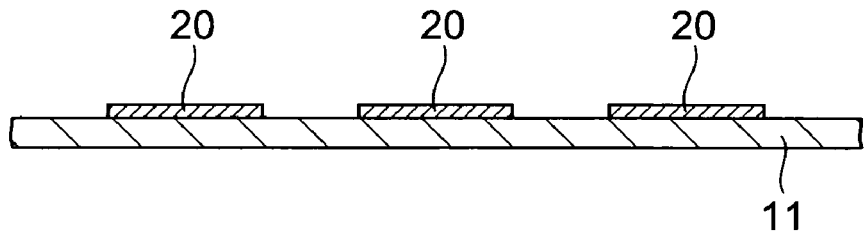

The resist pattern 10 having a sufficiently narrow trench width in accordance with the present invention is used as a mask pattern for forming a thin-film pattern. FIG. 3 is a sectional view for explaining an embodiment of the thin-film pattern forming method. First, in this embodiment, the thin film 12 is removed from the part free of the resist pattern 10 by etching ((a) of FIG. 3). Preferably, the etching of the thin film 12 is carried out by dry etching such as milling or RIE.

Subsequently, the resist pattern 10 is removed, so as to yield a thin-film pattern 20 formed on the support 11 ((b) of FIG. 3). The resist pattern 10 is removed by a solvent such as NMP or acetone.

Figure 4:
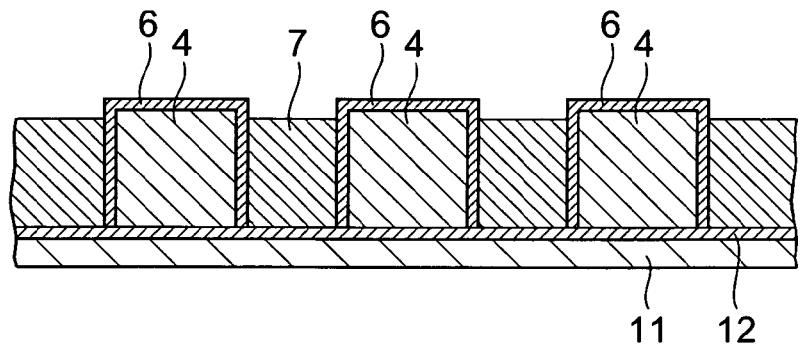
FIG. 4 is a sectional view for explaining an embodiment of the thin-film pattern forming method in accordance with the present invention.
Figure 4:
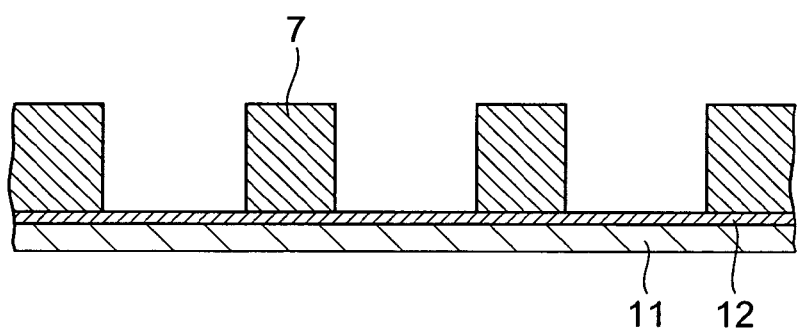
Figure 4:
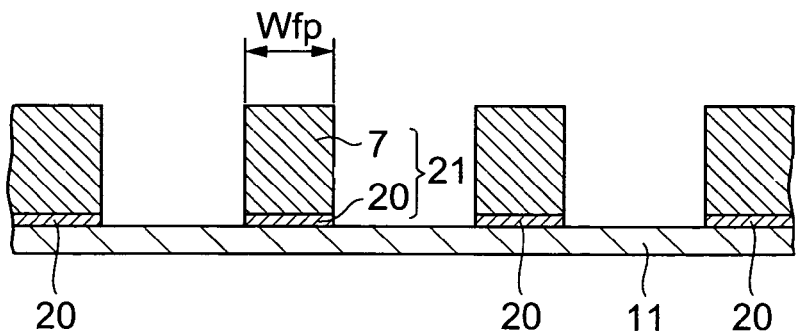

FIG. 4 is a sectional view for explaining another embodiment of the thin-film pattern forming method. First, in this embodiment, a plating layer 7 is formed on the thin film 12 in the part free of the resist pattern 10 while using the conductive thin film 12 as a base electrode ((a) of FIG. 4). The plating layer 7 is formed by deposition of a material such as NiFe or Cu which can form a plating layer. Preferably, the thin film 12 is formed of the same material as the plating layer 7.

Subsequently, the resist pattern 10 is removed ((b) of FIG. 4), and then the thin film 12 is removed from the part free of the plating layer 7 by etching, so as to yield a thin-film pattern 21 including the plating layer 7 and thin-film pattern 20. The removal of the resist pattern 10 and the etching of the thin film 12 are carried out as in the above-mentioned embodiment explained with reference to FIG. 3. Let Wfp be the width of the thin-film pattern 21 itself.

The thin-film patterns 20 and 21 shown in (b) of FIG. 3 and (c) of FIG. 4 are sufficiently narrowed in terms of their interval and width. When these thin-film patterns are used as a part of a microdevice, e.g., a magnetic pole, lead, or the like of a thin-film magnetic head, a microdevice having a sufficiently high density can be obtained.

Figure 5:
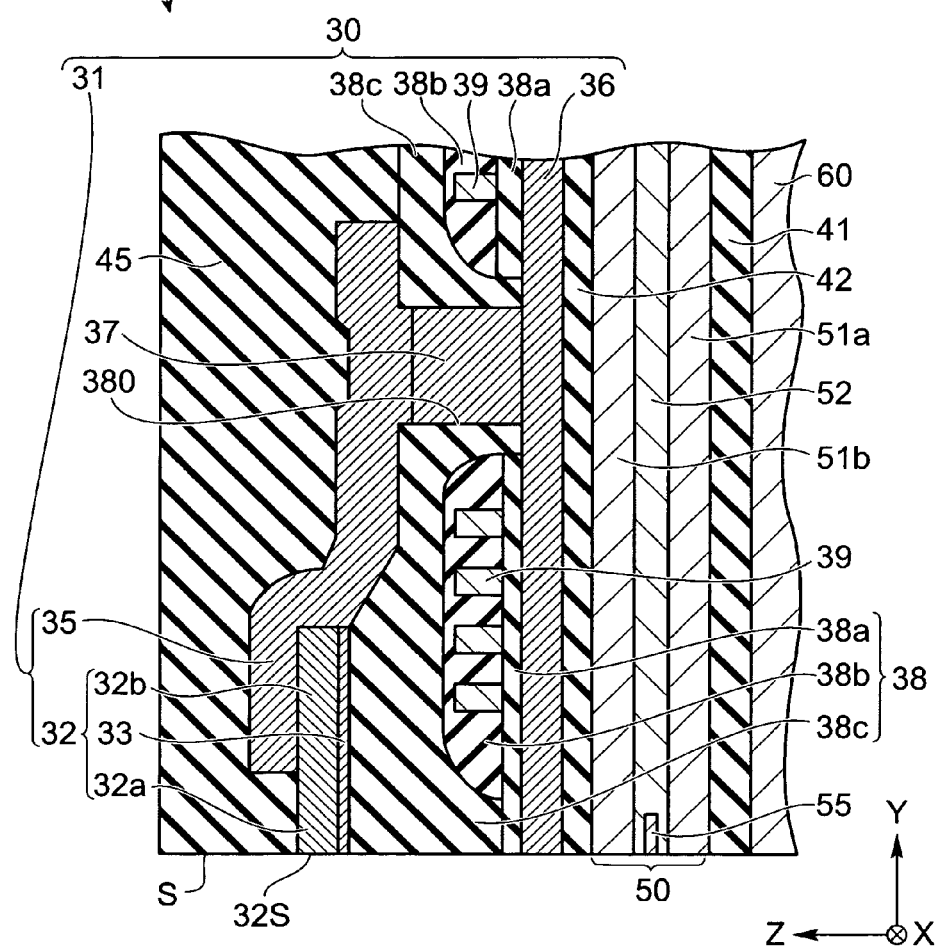
FIG. 5 is an end face view showing a thin-film magnetic head as an embodiment of the microdevice obtained by the microdevice manufacturing method in accordance with the present invention.
Figure 5:
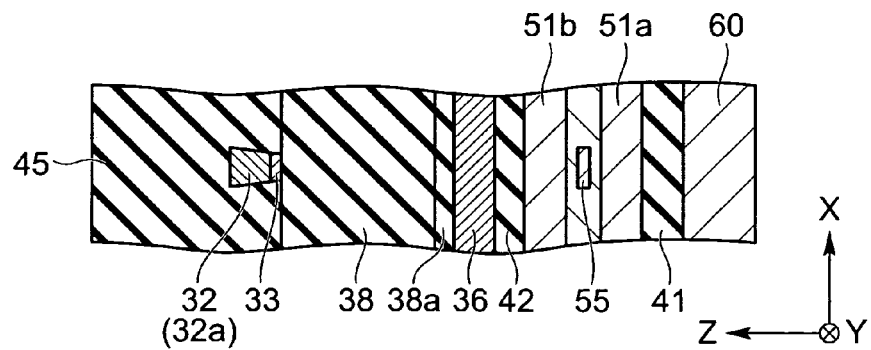

FIG. 5 is a sectional view schematically showing a thin-film magnetic head as an embodiment of a microdevice obtained by a microdevice manufacturing method comprising a step of forming a thin-film pattern by the thin-film pattern forming method such as the one mentioned above. The thin-film magnetic head 100 shown in FIG. 5 performs an operation of recording magnetic information at a position where its medium-opposing surface S opposes a recording surface of a recording medium (not depicted). In FIG. 5, (a) and (b) show a section perpendicular to the medium-opposing surface S and an end face of the thin-film magnetic head as seen from the medium-opposing surface S side, respectively.

The thin-film magnetic head 100 has a structure in which an insulating layer 41 made of a nonmagnetic insulating material, a read head part 50 for reading magnetic information by using a magnetoresistive effect, a separation layer 42 made of a nonmagnetic insulating layer, a recording head part 30 for executing a magnetic recording process, and an overcoat layer 45 made of a nonmagnetic insulating material are laminated in this order on a base layer 60 made of a ceramic material such as $Al_2O_3.TiC$.

The recording head part 30 is provided on the read head part 50 with the separation layer 42 interposed therebetween. The recording head part 30 has a structure in which an auxiliary magnetic pole 36 adjacent to the separation layer 42, a gap layer 38 in which a thin-film coil 39 is buried, and a magnetic pole 31 are laminated in this order. The magnetic pole 31 and the auxiliary magnetic pole 36 are magnetically connected to each other through a junction 37 made of a magnetic material filling an opening 380 of the gap layer 38.

The magnetic pole 31 is disposed adjacent to the gap layer 38. Namely, the magnetic pole 31 is provided on a main surface of a support employing a laminate constructed by the base layer 60, read head part 50, separation layer 42, auxiliary magnetic pole 36, gap layer 38 in which the thin-film coil 39 is buried, and junction 37 as a whole.

The magnetic pole 31 includes a magnetic flux emitting part 32 having an exposed surface 32S exposed to the medium-opposing surface S side, and a yoke part 35 formed such as to cover the part opposite to the medium-opposing surface S in the magnetic flux emitting part from its surroundings while being magnetically connected to the junction 37.

The magnetic flux emitting part 32 is constructed by a rod-shaped pole part 32a having the exposed surface 32S exposed to the medium-opposing surface S side, a supporting part 32b provided on the side opposite to the exposed surface 32S of the pole part 32a, and a seed layer 33 disposed adjacent to the supporting part 32b.

The above-mentioned thin-film pattern forming method is employed when forming this magnetic flux emitting part 32, for example. Namely, the seed layer 33, which is a thin film, is patterned by the above-mentioned thin-film pattern forming method, and the pole part 32a and the supporting part 32b are formed as plating layers on the seed layer 33, whereby the magnetic flux emitting part 32 is formed. Before forming the plating layers in this case, the resist pattern may be heated, so as to incline a wall surface of the resist pattern, thereby tilting a side face of the pole part 32a.

The seed layer 33, pole part 32a, and supporting part 32b are favorably formed by soft magnetic materials such as materials containing iron and nitrogen, materials containing iron, zirconia, and oxygen, and materials containing iron and nickel, for example. More specifically, for example, permalloy (Ni: 45%; Fe: 55%), iron nitride (FeN), iron-cobalt alloy, FeM and FeCoM (where M is at least one species selected from the group consisting of nickel, nitrogen, carbon, boron, silicon, aluminum, titanium, zirconia, hafnium, molybdenum, tantalum, niobium, and copper) which are alloys containing iron, and the like can be employed.

The gap layer 38 is constructed by three gap layer parts 38a, 38b, and 38c. The gap layer part 38a is disposed adjacent to the auxiliary magnetic pole 36, whereas the thin-film coil 39 having a winding structure spirally wound about the opening 380 is provided on the gap layer part 38a. The gap layer part 38b is provided so as to cover the gaps between windings of the thin-film coil 39 and their surrounding areas, whereas the gap layer part 38c forms the opening 380 while covering the gap layer part 38b.

The read head part 50 has a structure in which a lower lead shield layer 51a adjacent to the insulating layer 41, a shield gap film 52, and an upper lead shield layer 51b are laminated in this order. A magnetoresistive device 55 as a read device is buried in the shield gap film 52 and is exposed to the medium-opposing surface S side. The magnetoresistive device 55 detects the magnetic information of the recording medium by utilizing the giant magnetoresistive (GMR) effect, tunneling magnetoresistive (TMR) effect, or the like, for example, thereby functioning as a read device.

The part other than the magnetic flux emitting part 32 in the thin-film magnetic head 100 can be formed by appropriately employing materials and forming methods typically used in the manufacture of thin-film magnetic heads. The microdevice manufacturing method of the present invention is favorably employed in particular in the method of manufacturing a thin-film magnetic head, and is also favorable as a manufacturing method which can make microdevices such as thin-film inductors, semiconductor devices, thin-film sensors, and thin-film actuators finer in the manufacturing thereof.

EXAMPLES

The present invention will now be explained more specifically.

Preparation of Resin Composition

A resin composition was obtained by adding 20 g of pure water to 160 g of an aqueous solution containing 5 wt % of polyvinyl acetal KW3 manufactured by Sekisui Chemical Co., Ltd., 20 g of an aqueous solution containing about 10 wt % of (N-methoxymethyl)methoxyethyleneurea, 20 g of (N-methoxymethyl)hydroxyethyleneurea, and 20 g of N-methoxymethylurea, and stirring and mixing them for 6 hr at room temperature.

The aqueous solution containing 5 wt % of polyvinyl acetal KW3 was obtained by adding 400 g of pure water to 100 g of an aqueous solution containing 20 wt % of polyvinyl acetal resin S-LEC KW3, and stirring and mixing them for 6 hr at room temperature by using a 1-L measuring flask. The aqueous solution of (N-methoxymethyl)methoxyethyleneurea was obtained by adding 860 g of pure water and 40 g of IPA (isopropanol) to 100 g of (N-methoxymethyl)methoxyethyleneurea, and stirring and mixing them for 6 hr at room temperature by using a 1-L measuring flask.

Examples 1 to 6

A thin film of Ni (having a thickness of 100 nm) was formed by sputtering on a surface of an Si substrate having a diameter of 6 inches, so as to yield a substrate (hereinafter referred to as "Ni substrate") comprising the Si substrate and Ni thin film. Then, a patterned resist layer was formed on the Ni substrate as follows:

Chemically-amplified polyhydroxystyrene-based resist AZ DX5105P (product name; manufactured by AZ Electronic Materials Co., Ltd.), which was a resist for a wavelength of 248 nm (KrF excimer laser) and contained an acid-generating material adapted to generate an acid upon heating, was applied by spin-coating onto the Ni substrate such as to yield a thickness of 500 nm after prebaking. The applied resist was prebaked by heating for 90 sec at 100° C. by a hotplate, then cooled to room temperature by a cooling plate, and thereafter exposed to light through a mask by using a DUV stepper (NSR-EX14D (product name) manufactured by Nikon Corp., NA=0.65, σ=0.7). It was further heated for 90 sec at 110° C. by a hotplate, then cooled to room temperature by a cooling plate, and thereafter developed for 60 sec with an aqueous solution containing 2.38 mass % of tetramethylammonium hydroxide (TMAH), so as to form a patterned resist layer. The trench width Wr of this resist layer was 300 nm when measured by using CD-SEM S9200 (hereinafter referred to as "CD-SEM") manufactured by Hitachi, Ltd.

Next, the resist layer together with the substrate was plasma-processed in a gas atmosphere containing a fluorocarbon. The plasma processing was performed at a pressure of 133.322 Pa (1 Torr), a power of 200 W, a nitrogen gas flow rate of 20 sccm, and a tetrafluoromethane gas flow rate of 5 sccm by using System 104 manufactured by Matrix. The substrate temperature was 30° C., whereas the processing time was 3 sec. During this time, the trench width Wr was unchanged.

Subsequently, the resin composition prepared by the above-mentioned method was applied so as to cover the plasma-processed resist layer, then heated for 60 sec at 80° C., and thereafter further heated for 90 sec at 95, 100, 105, 110, 115, and 120° C. in Examples 1 to 6, respectively. After being cooled to room temperature by a cooling plate, the resin composition was removed from the part excluding the crosslinked layer by washing with water, so as to yield resist patterns of Examples 1 to 6 in which the resist layer was covered with the crosslinked layer. The trench width Wf of each of the resulting resist patterns was measured by using CD-SEM.

Further, a plating pattern was formed from thus obtained resist pattern.

First, as preprocessing for plating, the Ni substrate formed with the resist pattern was washed with an aqueous solution containing 5% of HCl, and then washed with water.

Next, using an NiFe plating bath of a plating liquid comprising the components in the composition shown in Table 1, NiFe was formed by a thickness of about 4 μm by frame plating employing the frame mentioned above, then washed with water, and dried. The plating was performed under the condition with a bath temperature of 40° C., a current density of $3.5 \times 10^{-3}$ A/cm$^2$, and an anode of NiFe.

TABLE 1

| Component | Composition (g/L) |
| --- | --- |
| Nickel sulfate hexahydrate (NiSO$_4$•6H$_2$O) | 350 |
| Ferrous sulfate heptahydrate (FeSO$_4$•7H$_2$O) | 10 |
| Boric acid (H$_3$BO$_3$) | 30 |
| Ammonium chloride (NH$_4$Cl) | 20 |
| Saccharine sodium dihydrate (C$_7$H$_4$NNaO$_3$S•2H$_2$O) | 1 |
| Sodium lauryl sulfate (CH$_3$(CH$_2$)$_{11}$OSO$_3$Na) | 0.05 |

Next, the frame was dissolved and removed by acetone, and then dried, so as to yield a plating pattern.

Using this plating pattern as a mask, milling was performed for 3 min. When the width Wfp of the plating pattern after the milling was measured by FIB, the measured value was equal to the trench width Wf of the resist pattern in each case.

Comparative Examples 1 to 6

Resist patterns of Comparative Examples 1 to 6 were obtained as in Examples 1 to 6 except for excluding the plasma processing step. The trench width Wf of each of thus obtained resist patterns was measured by using CD-SEM.

The CD-SEM measurement, milling, and FIB measurement in Examples 1 to 6 and Comparative Examples 1 to 6 were carried out in the following conditions:

CD-SEM apparatus: S9200 (product name) manufactured by Hitachi, Ltd.; acceleration voltage: 800 V; beam current: 10 pA; measurement magnification: 200,000×; number of image integrations: 64; threshold at automatic measurement: 50%.

Milling milling apparatus: IBE-IBD (product name) manufactured by Veeco Instruments; gas: Ar; gas flow rate: 10 sccm; pressure: $2 \times 10^{-4}$ Torr; milling angle: 90° (to the substrate surface); beam current: 300 mA; beam voltage: 300 V, DC; acceleration voltage: −500 V.

FIB apparatus: DB-865 manufactured by FEI Company; acceleration voltage: 10 kV; beam current: 100 pA; measurement magnification: 20,000×; number of image integrations: 1; threshold at automatic measurement: 50%.

The values obtained by subtracting the trench widths Wf of the resist patterns obtained in Examples 1 to 6 and Comparative Examples 1 to 6 from their corresponding trench widths Wr of the resist layers are shown as narrowed trench widths (Wr-Wf) together with the second heating temperatures in Table 2.

TABLE 2

| | Temperature (° C.) | Narrowed trench width (nm) |
| --- | --- | --- |
| Example 1 | 95 | 28 |
| Example 2 | 100 | 54 |
| Example 3 | 105 | 75 |
| Example 4 | 110 | 86 |
| Example 5 | 115 | 91 |
| Example 6 | 120 | 92 |
| Comparative Example 1 | 95 | 5 |
| Comparative Example 2 | 100 | 16 |
| Comparative Example 3 | 105 | 30 |
| Comparative Example 4 | 110 | 40 |
| Comparative Example 5 | 115 | 46 |
| Comparative Example 6 | 120 | 48 |

Table 2 clarifies that, as compared with Comparative Examples 1 to 6 in which the resin composition was crosslinked at the same temperatures, Examples 1 to 6 yield resist patterns with greater narrowed trench widths (Wr-Wf) and thus can make the trench widths Wf sufficiently smaller.

What is claimed is:

1. A resist pattern forming method comprising the steps of:

plasma-processing a surface of an acid-feedable resist layer formed and patterned on a surface of a substrate in a gas atmosphere containing a fluorocarbon to acidify the surface during the plasma-processing, wherein the surface is exposed to the gas atmosphere throughout the plasma-processing;

attaching a resin composition crosslinkable in the presence of an acid to the plasma-processed surface of the resist layer;

crosslinking the resin composition in a part in contact with the resist layer by feeding an acid from the resist layer, so as to form a crosslinked layer covering the resist layer; and removing the resin composition from a part excluding the crosslinked layer after the formation of the crosslinked layer, so as to yield a resist pattern comprising the resist layer and the crosslinked layer covering the resist layer.

2. A resist pattern forming method according to claim 1, wherein the part in contact with the resist layer in the resin composition is crosslinked by heating or exposure to light in the step of forming the crosslinked layer.

3. A thin-film pattern forming method comprising the steps of:

forming a resist pattern on a thin film of a substrate having a surface formed with the thin film by the method according to claim 1;

removing the thin film from a part free of the resist pattern by etching; and removing the resist pattern, so as to yield a thin-film pattern.

4. A thin-film pattern forming method comprising the steps of:

forming a resist pattern on a thin film of a substrate having a surface formed with the thin film by the method according to claim 1;

forming a plating layer on the thin film in a part free of the resist pattern and then removing the resist pattern; and removing the thin film from the part free of the resist pattern by etching, so as to yield a thin-film pattern laminated with the plating layer.

5. A microdevice manufacturing method comprising the step of forming a thin-film pattern by the method according to claim 3.

6. A microdevice manufacturing method comprising the step of forming a thin-film pattern by the method according to claim 4.

* * * * *